(12) United States Patent
Yamaguchi

(10) Patent No.: US 7,410,812 B2
(45) Date of Patent: Aug. 12, 2008

(54) MANUFACTURE OF SEMICONDUCTOR DEVICE HAVING INSULATION FILM OF HIGH DIELECTRIC CONSTANT

(75) Inventor: Masaomi Yamaguchi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 0 days.

(21) Appl. No.: 11/089,503

(22) Filed: Mar. 25, 2005

(65) Prior Publication Data

US 2005/0167768 A1 Aug. 4, 2005

Related U.S. Application Data

(63) Continuation of application No. PCT/JP03/03198, filed on Mar. 17, 2003.

(51) Int. Cl.
*H01L 21/00* (2006.01)

(52) U.S. Cl. .................. 438/3; 438/240; 257/E27.104; 257/E29.272; 257/E21.208; 257/E21.436

(58) Field of Classification Search ...... 438/3, 438/240, 785, FOR. 395; 257/E27.104, E29.272, 257/E21.208, E21.436

See application file for complete search history.

(56) References Cited

U.S. PATENT DOCUMENTS

| | | |
|---|---|---|
| 6,444,592 B1 | 9/2002 | Ballantine et al. |
| 6,475,928 B1 | 11/2002 | Berenguer et al. |
| 6,483,172 B1 | 11/2002 | Cote et al. |
| 6,642,131 B2 | 11/2003 | Harada |
| 6,720,259 B2 * | 4/2004 | Londergan et al. .......... 438/680 |
| 6,762,114 B1 * | 7/2004 | Chambers .................. 438/591 |
| 2001/0051444 A1 * | 12/2001 | Lim et al. .................. 438/778 |
| 2002/0195643 A1 | 12/2002 | Harada |
| 2003/0040196 A1 | 2/2003 | Lim et al. |
| 2003/0049942 A1 | 3/2003 | Haukka et al. |
| 2004/0011279 A1 * | 1/2004 | Joo ............................... 117/88 |
| 2004/0127003 A1 * | 7/2004 | Chambers ................... 438/591 |
| 2004/0161899 A1 * | 8/2004 | Luo et al. .................... 438/287 |

FOREIGN PATENT DOCUMENTS

| | | |
|---|---|---|
| EP | 0 900 859 A2 | 3/1999 |
| EP | 0 942 464 A2 | 9/1999 |
| EP | 1 127 956 A2 | 8/2001 |
| JP | 2001-267316 | 9/2001 |

(Continued)

OTHER PUBLICATIONS

European Search Report dated Feb. 16, 2007, issued in corresponding European Patent Application No. 03 70 8659.

(Continued)

*Primary Examiner*—Michelle Estrada
(74) *Attorney, Agent, or Firm*—Westerman, Hattori, Daniels & Adrian, L.L.P.

(57) ABSTRACT

A method contains the steps of (a) heating a silicon substrate in a reaction chamber; and (b) supplying film-forming gas containing source gas, nitridizing gas, and nitridation enhancing gas to a surface of the heated silicon substrate, to deposit on the silicon substrate an $Hf_{1-x}Al_xO:N$ film ($0.1<x<0.3$) having a higher specific dielectric constant than that of silicon oxide, and incorporating N, by thermal CVD. The method can form an oxide film of $Hf_{1-x}Al_xO$ ($0<x<0.3$) having desired characteristics, as a gate insulation film.

9 Claims, 7 Drawing Sheets

FOREIGN PATENT DOCUMENTS

| | | |
|---|---|---|
| JP | 2001-274378 | 10/2001 |
| JP | 2002-289615 | 10/2002 |
| JP | 2002-289615 A | 10/2002 |
| JP | 2003-8005 | 1/2003 |
| JP | 2003-008005 A | 1/2003 |
| KR | 2003-0018134 | 3/2003 |

OTHER PUBLICATIONS

Hyung-Seok Jung et al., Improved Current Performance of CMOSFETs with Nitrogen Incorporated $HfO_2$-$Al_2O_3$ Laminate Gate Dielectric, IEEE, Advanced Process Development Project, System LSI Business, Samsung Electronics Co., Ltd., et al., 2002, pp. 853-856.

W. Zhu et al., $HfO_2$ and HfAlO for CMOS: Thermal Stability and Current Transport, IEEE, Yale University, 2001, pp. 463-466.

M.R. Visokay et al., Application of HfSiON as a gate dielectric material, American Institute of Physics, Applied Physics Letters, vol. 80, No. 17, Apr. 29, 2002, pp. 3183-3185.

Hang Hu et al, MIM Capacitors Using Atomic-Layer-Deposited High-$\kappa$ $(HfO_2)_{1-x}(Al_2O_3)_x$ Dielectrics, IEEE Electron Device Letters, vol. 24, No. 2, Feb. 2003, pp. 60-62.

Chinese Office Action dated Oct. 13, 2006, issued in corresponding Chinese Application No. 03820517.3.

Korean Office Action dated Oct. 31, 2006, issued in corresponding Korean Application No. 10-2005-7004833.

W.J. Zhu et al., "Effect of Al Inclusion in $HfO_2$ on the Physical and Electrical Properties of the Dielectrics", IEEE Electron Device Letters, vol. 23, No. 11, Nov. 2002, pp. 649-651.

Japanese Office Action dated Apr. 13, 2007 (mailing date), issued in corresponding Japanese Patent Application No. 2004-569555.

* cited by examiner

BTBAS

FIG. 5

| | | R (300sccm) | | |
|---|---|---|---|---|
| | | TTBAl | TEAl | TDMAHf |
| 1 | R+O$_2$(100sccm)+N$_2$(700sccm) | × | × | × |
| 2 | R+NH$_3$(300sccm)+N$_2$(500sccm) | ○ | △ | × |
| 3 | R+NH$_3$(300sccm)+H$_2$(300sccm)+N$_2$(200sccm) | ◎ | ○ | ○ |
| 4 | R+O$_2$+N$_2$/NH$_3$+N$_2$(1100sccm) | ○ | ○ | △ |
| 5 | R+O$_2$+H$_2$+N$_2$/NH$_3$+H$_2$+N$_2$(1100sccm) | ◎ | ◎ | ◎ |
| | | TTBAl+TDMAHf | | |
| | | ◎ | | |

× : N not detected
△ : N detected
○ : N mixed
◎ : N more mixed

MANUFACTURE OF SEMICONDUCTOR DEVICE HAVING INSULATION FILM OF HIGH DIELECTRIC CONSTANT

CROSS REFERENCE TO RELATED APPLICATION

This application is a continuation application of International Patent Application No. PCT/JP03/03198, filed on Mar. 17, 2003, the entire contents of which are incorporated herein by reference.

BACKGROUND OF THE INVENTION

A) Field of the Invention

The present invention relates to a semiconductor device and a method of manufacturing a semiconductor device, and, more particularly, to a semiconductor device having an insulation film of a high dielectric constant and a method of manufacturing the semiconductor device.

B) Description of the Related Art

Insulated gate (IG) field effect transistors (FETs), typical examples of which are MOS transistors, are widely used as typical semiconductor devices used in a semiconductor integrated circuit device. For a larger scale integration of semiconductor integrated circuit devices, IG-FETs have been miniaturized according the scaling law. Miniaturization reduces the sizes of IG-FETs, such as making the gate insulation film thinner and shortening the gate length, to improve the performances of miniaturized devices while keeping the normal performances.

A MOS transistor has a silicon gate electrode on a gate oxide film. The silicon gate electrode is doped with n-type impurity such as phosphor (P) or arsenic (As), or p-type impurity such as boron (B). As the gate oxide film becomes thin, there occurs a phenomenon that the impurity in the gate electrode penetrates through the gate oxide film, and diffuses into the underlying channel region. When the impurity in the gate electrode diffuses into the channel region, it lowers the threshold voltage of the transistor, and causes punch-through. Especially, the penetration of boron in the p-channel transistor is of problem.

It is known that introduction of nitrogen in the gate oxide film is effective for preventing penetration of boron. Nitrogen can be introduced into the gate oxide film, for example by conducting thermal nitridation after forming a gate oxide film by thermal oxidation.

The gate insulation films of MOS transistors of the next generation should be made as thin as 2 nm or less. With that film thickness, the tunnel current starts flowing, the gate leak current becomes uncontrollable, and an increase in power dissipation cannot be avoided. To suppress the tunnel current which flows through the gate insulation film, the gate insulation film in use should be thick.

To increase the physical thickness of the gate insulation film while keeping the equivalent thickness of the gate insulation film based a silicon oxide film at most 2 nm, the use of a high specific-dielectric-constant insulation material having a dielectric constant higher than that of a silicon oxide for the gate insulation film has been proposed.

Japanese Patent Laid-Open Publication No. 2001-274378 proposes the use of barium titanate $(Ba(Sr)TiO_3)$, titanium oxide $(TiO_2)$, tantalum oxide $(Ta_2O_5)$, zirconium oxide $(ZrO_2)$, hafnium oxide $(HfO_2)$, silicon nitride $(Si_3N_4)$, or alumina $(Al_2O_3)$, which has a specific dielectric constant higher than that of silicon oxide, for a gate insulation film. The publication also proposes a structure where a silicon oxide film is intervened between such a high specific-dielectric-constant insulation film and a silicon substrate.

The use of a new material having a high specific dielectric constant for the gate insulation film of an IG-FET brings about a new problem. Solving such a new problem is desired to promote the practical use of new materials.

SUMMARY OF THE INVENTION

An object of the invention is to provide a semiconductor device having a gate insulation film for which a high specific-dielectric-constant insulation material having a specific dielectric constant higher than that of a silicon oxide is used.

Another object of the invention is to provide a manufacture method for a semiconductor device, which can form a gate insulation film of a high specific-dielectric-constant insulation material having a specific dielectric constant higher than that of silicon oxide.

A further object of the invention is to provide a semiconductor device which uses an oxide film of $Hf_{1-x}Al_x$ (0<x<0.3) incorporating nitrogen as a gate insulation film.

A yet further object of the invention is to provide a manufacture method for a semiconductor device which can form an oxide film of $Hf_{1-x}Al_x$ (0<x<0.3) incorporating nitrogen as a gate insulation film.

In this specification, the term "film-forming gas" may be used to mean positive composition gas used for deposition, excluding inert carrier gas.

According to one aspect of the invention, there is provided a method of manufacturing a semiconductor device comprising the steps of: (a) heating a silicon substrate in a reaction chamber; and (b) depositing an insulating film having a specific dielectric constant higher than that of silicon oxide on said heated silicon substrate by thermal CVD, by supplying film-forming gas containing source gas, nitridizing gas, and nitridation enhancing gas to a surface of said heated silicon substrate.

According to another aspect of the invention, there is provided a semiconductor device comprising: a silicon substrate having an active region; a gate insulation film formed on a surface of the active region of the silicon substrate, and including a high-dielectric-constant insulation film essentially consisting of oxide of $Hf_{1-x}Al_x$ (0<x<0.3), which includes N of at least 0.5 at %, and has a specific dielectric constant higher than that of silicon oxide; a gate electrode formed on the gate insulation film and including an impurity-doped silicon layer; and source/drain regions formed on both sides of the gate electrode by doping impurity in the active region of the silicon substrate.

It is not always easy to introduce nitrogen into metal oxide. Introduction of nitrogen is enhanced by CVD using a nitridizing gas and nitridation enhancing gas. As nitridizing gas, it is preferable to use at least one of ammonia, bis-tertial-butyl amino silane (BTBAS), and tri-ethyl amine (TEN). As nitridation enhancing gas, it is preferable to use a gas comprising hydrogen.

BRIEF DESCRIPTION OF THE DRAWINGS

FIG. 5 is a table showing the results of the experiment; and

DESCRIPTION OF THE PREFERRED EMBODIMENTS

Hafnium oxide is an insulator which can provide a specific dielectric constant several to ten and several times as large as the specific dielectric constant of silicon oxide, and has a high potential as the gate insulation film of an IG-FET. Hafnium oxide (hafnia) is easily crystallized, and it is not easy to form a dense film of a thin and uniform thickness. When a gate insulation film is made of hafnium oxide only on a silicon substrate, a crystalline insulation film with a large leak current is likely to be formed.

The crystallization can be suppressed by mixing aluminum oxide (alumina) ($Al_2O_3$) in the hafnium oxide ($HfO_2$). The suppressed crystallization reduces the leak current. The aluminum oxide has a specific dielectric constant lower than that of the hafnium oxide. To acquire a specific dielectric constant as high as possible, it is preferable that the amount of the aluminum oxide to be mixed in the hafnium oxide should be limited to $Hf_{1-x}Al_xO$ (0<x<0.3). For suppression of crystallization, $Hf_{1-x}Al_xO$ (0.1<x<0.3) is desirable.

Such an oxide insulation film having a high specific dielectric constant cannot be formed by thermal oxidization of a silicon substrate. Thermal chemical vapor deposition (CVD) is known as a process capable of forming an oxide insulation film of high quality and high specific dielectric constant, without adversely affecting the substrate.

It is preferable to introduce nitrogen in the gate insulating film, for preventing penetration of impurity from the gate electrode. The present inventor tried to introduce nitrogen into HfAlO. Trial was made to introduce nitrogen, first into $HfO_2$ and $Al_2O_3$, respectively, and then into HfAlO. Description will be made hereinbelow on the experiments carried out by the inventor.

Figure 1A:
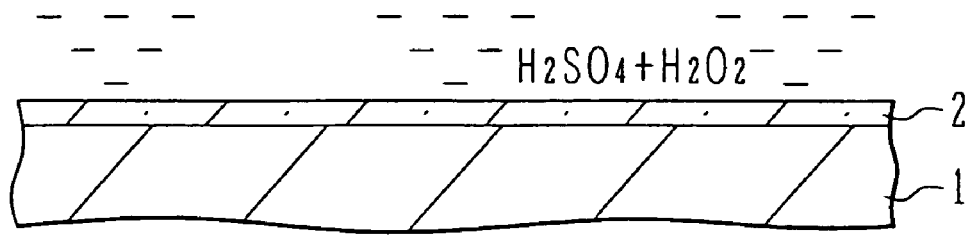
FIGS. 1A to 1G are cross-sectional views for illustrating a method of forming a high specific-dielectric-constant insulation film on a silicon substrate by CVD.

As shown in FIG. 1A, the surface of a silicon substrate 1 was cleaned with $H_2SO_4+H_2O_2$ with a composition of $H_2SO_4$:$H_2O_2$=50:1. A natural oxide film 2 is being formed on the surface of the silicon substrate 1. Contaminant adhered on the surface of the natural oxide film 2 is cleaned.

Figure 1B:
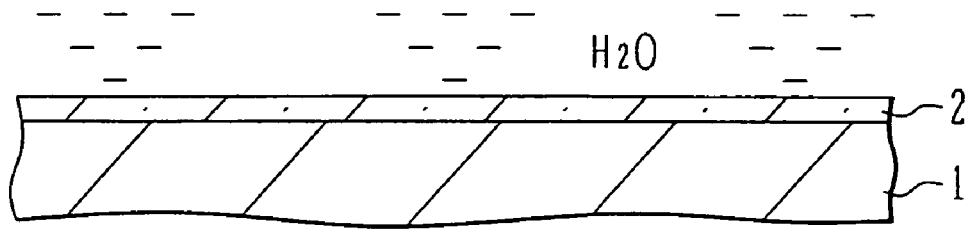

As shown in FIG. 1B, the silicon substrate 1 was rinsed in flowing pure water for ten minutes. The residual after the cleaning with $H_2SO_4+H_2O_2$ is rinsed out with pure water.

Figure 1C:
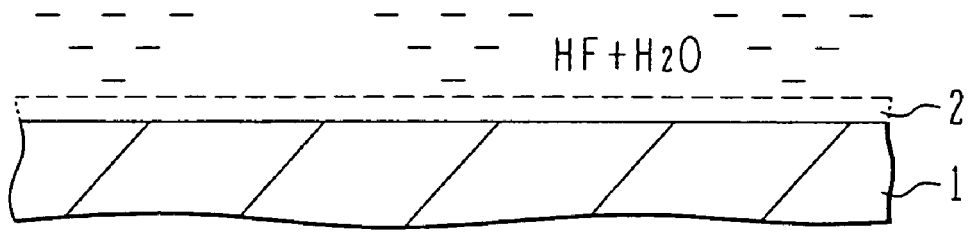

As shown in FIG. 1C, the silicon substrate 1 was dipped in dilute Hf aqueous solution of HF:$H_2O$=1:20 for about one minute to remove the natural oxide film 2 off the surface of the silicon substrate 1.

Figure 1D:
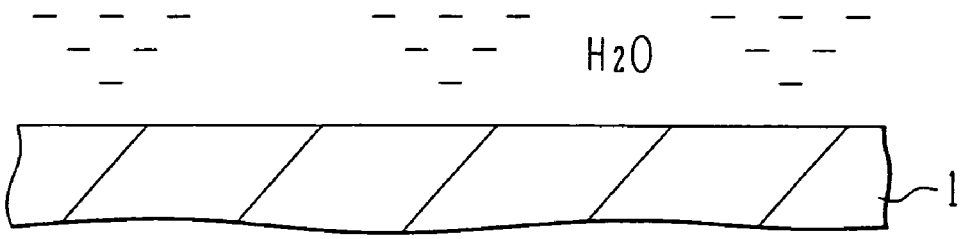

As shown in FIG. 1D, the silicon substrate 1 was rinsed in flowing pure water for ten minutes. The residual after the step of removing the oxide film with HF+$H_2O_2$ is rinsed out with pure water.

Figure 1E:
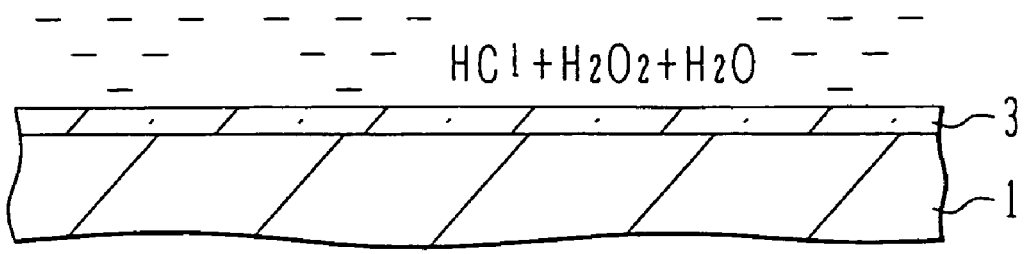

As shown in FIG. 1E, the silicon substrate was cleaned with SC2 (HCl:$H_2O_2$:$H_2O$=1:1:5), forming a chemical oxide film 3 by SC2 on the silicon surface. A silicon oxide film 3 cleaner than the natural oxide film 2 is formed.

Figure 1F:
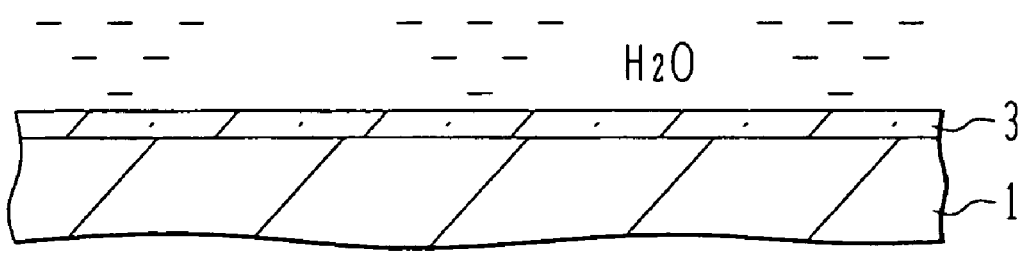

As shown in FIG. 1F, the silicon substrate 1 was rinsed in flowing pure water for ten minutes. The residual after the step of forming the oxide film with SC2 is rinsed out with pure water. Next, the substrate surface was dried with hot nitrogen drying. Then, the silicon substrate 1 was loaded into a CVD deposition apparatus.

Figure 1G:
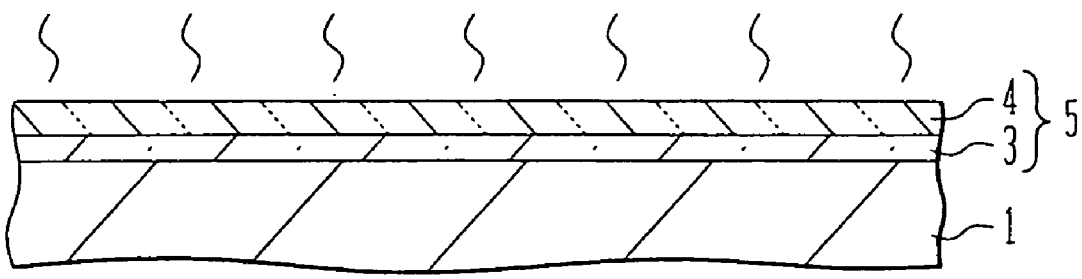

As shown in FIG. 1G, a high specific-dielectric-constant insulation film 4 of $Al_2O_3$, $HfO_2$, or HfAlO was deposited on the chemical oxide film 3 of the silicon substrate 1 by thermal CVD. As HfAlO, $Hf_{0.8}Al_{0.2}O$ was formed. The chemical oxide film 3 and the high specific-dielectric-constant insulation film 4 form a composite insulation film 5.

A $HfO_2$ film having a thickness of about 3 nm was grown on a silicon oxide film 3 having a thickness of about 1 nm, and a capacitance equivalent silicon oxide thickness (CET) of 1.6 nm was obtained. Similarly, an $Al_2O_3$ film having a thickness of about 3 nm was grown on a silicon oxide film 3 having a thickness of about 1 nm, and a capacitance equivalent silicon oxide thickness (CET) of 2.3 nm was obtained. A gate insulation film having an equivalent silicon oxide thickness (CET) of less than 2 nm can be formed, while forming an HfAlO insulation film of 3 nm or larger in thickness.

It is desired to introduce nitrogen into the high specific-dielectric-constant film, considering the penetration of impurity from the gate electrode into the channel region. Trial was made to introduce nitrogen into the high specific-dielectric-constant film, by mixing nitridizing gas into the film-forming gas of thermal CVD.

Figure 2:
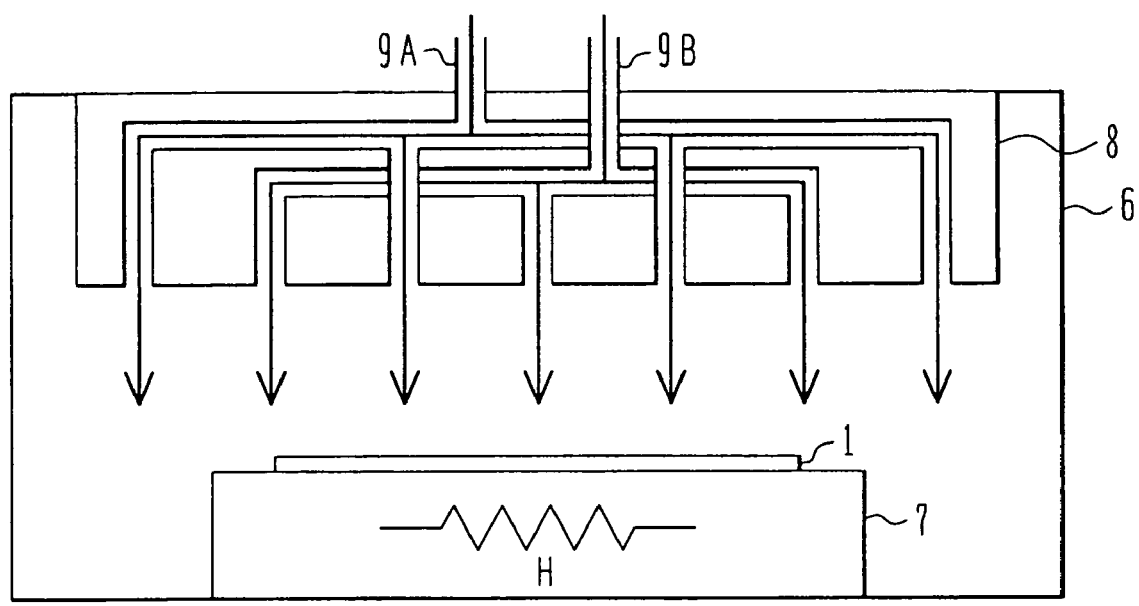
FIG. 2 is a schematic cross-sectional view illustrating the structure of a thermal CVD apparatus.

FIG. 2 schematically shows the structure of the thermal CVD film-forming apparatus. A shower head 8 is disposed in a reaction chamber 6, and a susceptor 7 with a heater H is placed under the shower head 8. The shower head 8 is provided with independent piping lines 9A and 9B through which film-forming gases such as Hf and Al source gases or so are supplied. The nitridizing gas $NH_3$ will react with the source gas, etc. when supplied together. It was necessary to supply $NH_3$ independently from the source gas.

Figure 3B:
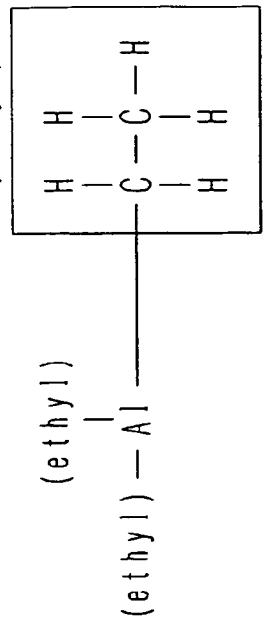
FIGS. 3A-3C show chemical configuration formulae of examples of organic Al sources, and an organic Hf source.
Figure 3C:
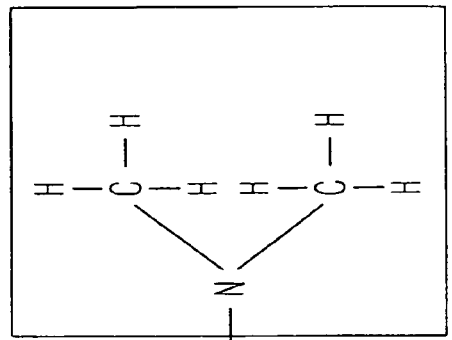
Figure 3A:
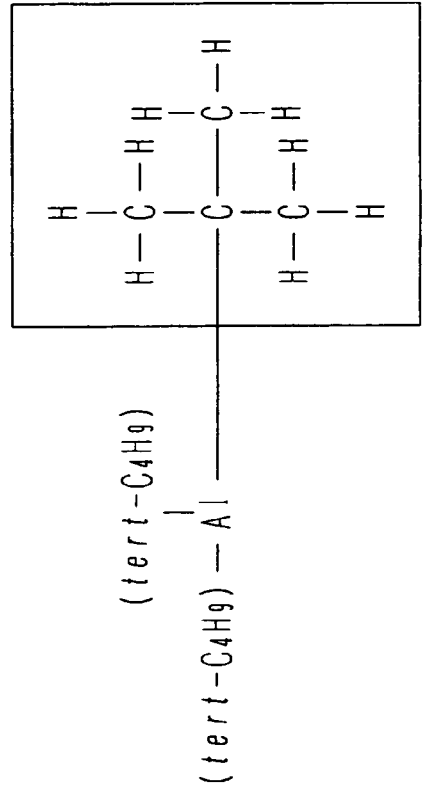

FIGS. 3A and 3B show chemical configuration formulae of $Al(t-C_4H_9)_3$ (tri-tertial-butyl aluminum; TTBAl), and $Al(C_2H_5)_3$ (tri-ethyl aluminum; TEAl) used as an organic metal source of Al.

FIG. 3C shows a chemical configuration formula of $Hf[N-(CH_3)_2]_4$ (tetra-dimethyl amino hafnium; TDMAHf), used as an organic metal source of Hf. These organic metal sources are liquid at the normal temperature, and the source gases were made by bubbling nitrogen gas therethrough.

Figure 4A:
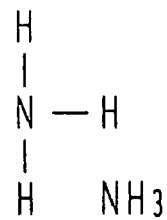
FIGS. 4A and 4C show chemical configuration formulae of examples of nitridizing gases.
Figure 4B:
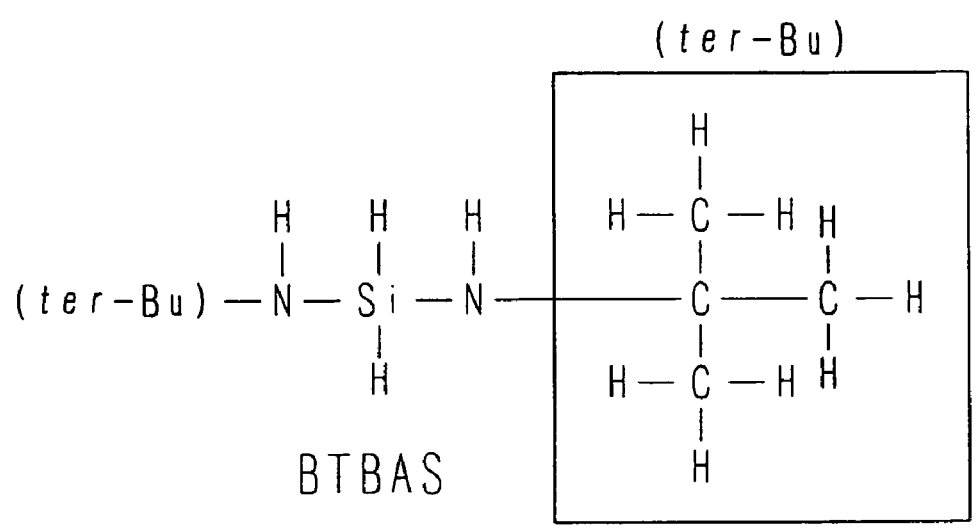
Figure 4C:
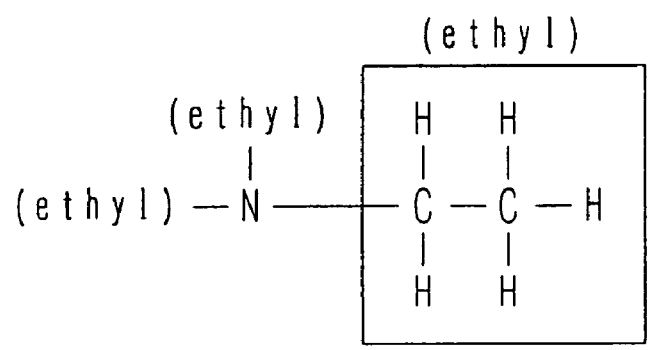

FIGS. 4A, 4B, and 4C show chemical configuration formulae of $NH_3$ (ammonia) used as nitridizing gas, and $SiH_2[NHt-C_4H_9]_2$ (bis-tertial-butyl amino silane, BTBAS) and $N(C_2H_5)_3$(tri-ethyl amine, TEN) which could be used as nitridizing gas. Hereinbelow, description will be made mainly on the case where $NH_3$ is used as the nitridizing gas.

Except the above, $O_2$, $H_2$, and $N_2$ were also used as the film-forming gas. The temperature of the susceptor 7, and hence the temperature of the silicon substrate 1 during deposition was set to 500° C. The pressure of atmosphere during deposition was set to 65 Pa. The total flow rate of the film-forming gas was set to 1100 sccm. $NH_3$ and the organic metal source gases were not mixed, and supplied through the two supply routes.

FIG. 5 shows five types of growths experimented. After a high specific-dielectric-constant insulation film was grown by thermal CVD, the existence of N was checked by Auger electron spectroscopy (AES). The detection sensitivity of AES was of % order. Although the detection sensitivity is not very high, sure existence can be found when detected. The detection of nitrogen in this AES means the existence of nitrogen of at least 0.5 at %.

In the first growth, organic metal source gas R of Al or Hf of 300 sccm, and $O_2$ of 100 sccm were used as the source gas and the carrier gas of $N_2$ of remaining 700 sccm was flown, to perform thermal CVD. The organic metal source gases of Al and Hf were TTBAl, TEAl, and TDMAHf. TTBAl, TEAl, and/or TDMAHf thermally decompose at the surface of the substrate, and Al and/or Hf contained in the source gas combine with oxygen, to form $Al_2O_3$ and/or $HfO_2$. N exists in the film-forming gas, but N was not detected in the deposited $Al_2O_3$ and/or $HfO_2$ film by AES.

In the second growth, $O_2$ was excluded from the film-forming gas of the first growth, and $NH_3$ of 300 sccm as the nitridizing gas was added. The remaining part of carrier gas became 500 sccm. Even though oxygen did not exist in the film-forming gas, oxide film could be deposited. It is considered that oxygen is supplied from the silicon oxide film under the high specific-dielectric-constant film, or from the air which is the atmosphere after the film formation.

In the case when TTBAl was used as the Al source gas, nitrogen was clearly detected by AES from the deposited $Al_2O_3$ film. The incorporation of nitrogen into the $Al_2O_3$ film could be confirmed. In the case when TEAl was used as the Al source gas, nitrogen was slightly detected by AES from the deposited $Al_2O_3$ film. The incorporation of nitrogen into the $Al_2O_3$ film could be confirmed. In the case when TDMAHf was used as the Hf source gas, nitrogen was not detected by AES from the deposited $HfO_2$ film.

In the third growth, $H_2$ of 300 sccm was added to the film forming gas of the second growth. The flow rate of the carrier gas $N_2$ was reduced to 200 sccm. Nitrogen was detected by AES from all the deposited $Al_2O_3$ and $HfO_2$ films. In the case when TTBAl was used as the Al source gas, nitrogen was much incorporated in the deposited $Al_2O_3$ film. In the case when TEAl was used as the Al source gas, nitrogen could be incorporated in the deposited $Al_2O_3$ film. In the case when TDMAHf was used as the Hf source gas, nitrogen could be incorporated in the deposited $HfO_2$ film. It can be found that the newly added hydrogen enhanced the nitridation.

In the fourth growth, supply of the film-forming gas of the first growth containing no nitridizing gas, and another supply of the gas which corresponds to the source gas of the second growth excluded of the source gas, i.e. only the nitridizing gas (plus carrier gas) were alternately done. The alternating supply was done, for example at a period of 20 seconds. Incorporation of nitrogen could be detected from the $Al_2O_3$ film using TTBAl as the Al source. Nitrogen could also be incorporated in the $Al_2O_3$ film using TEAl as the Al source. Nitrogen could also be detected, although slightly, from the $HfO_2$ film using TDMAHf as the Hf source.

Compared with the second growth, incorporation of nitrogen was generally enhanced. It can be considered that incorporation of nitrogen increases when the nitridizing gas is supplied alternately with the source, rather than supplying with the source simultaneously. In place of the alternating supply, it is also possible to change the composition ratio (composition of the film-forming gas) of the source and the nitridizing gas with time.

In the fifth growth, $H_2$ of 300 sccm was added to each of the source gas and the nitridizing gas of the fourth growth. The flow rate of the carrier gas was reduced to maintain the total flow rate of 1100 sccm. Incorporation of nitrogen was improved in each of the $Al_2O_3$ film using TTBAl as the Al source, the $Al_2O_3$ film using TEAl as the Al source, and the $HfO_2$ film using TDMAHf as the Hf source.

Further, good incorporation of nitrogen was confirmed when TTBAl of 30 sccm and TDMAHf of 300 sccm were simultaneously supplied as the source gas R, to deposit $Hf_{0.8}Al_{0.2}O$. HfAlO:N gate insulating films of less leak current, having a high specific-dielectric-constant, can be grown.

When ammonia was used as the nitridizing gas and hydrogen was used as the nitridation enhancing gas, incorporation of nitrogen became possible in the thermal CVD of $Al_2O_3$, $HfO_2$, and HfAlO. When the source gas and hydrogen were alternately supplied, incorporation of nitrogen was further improved. In cases of using BTBAS, and TEN as the nitridizing gas, nitrogen could also be detected by AES.

Each of the above experiments were conducted at the CVD deposition temperature of 500° C. Nitrogen could be incorporated in $Al_2O_3$, $HfO_2$, and HfAlO even when the deposition temperature was set at 400° C. It will be possible to incorporate nitrogen in $Al_2O_3$, $HfO_2$, and HfAlO at the deposition temperature of 400° C.-600° C.

An increase in atmosphere pressure during deposition showed a tendency of impairing the in-plane distribution of the high specific-dielectric-constant insulation film. The preferable pressure of atmosphere during deposition would be 10 Pa to 100 Pa.

In case when the source and the nitridizing gas are alternately supplied, the period can be variously varied. A period of 10 seconds to 120 seconds would be preferable.

$Hf(OtC_4H_9)_4$ was used as the organic metal source of Hf. Nitrogen could not be detected in any of the growths. It is considered that the molecule contains O, and $HfO_4$ is likely to be formed and it becomes difficult to incorporate nitrogen. Once $HfO_4$ is formed, it would be difficult to decompose Hf—O bond and form Hf—N bond, since the dissociation energy of Hf—O is high. For incorporating N, it would be preferable not to contain O in the metal source.

Description has been made on the cases of thermal CVD of $Al_2O_3$, $HfO_2$, and HfAlO. It would be possible to incorporate nitrogen when other nitridizable, high specific-dielectric-constant film is grown by thermal CVD, by using nitridizing gas and nitridatiion enhancing gas. The source gas is not limited to organic metal, but the possibility would be high especially when organic metal source is used.

Figure 6A:
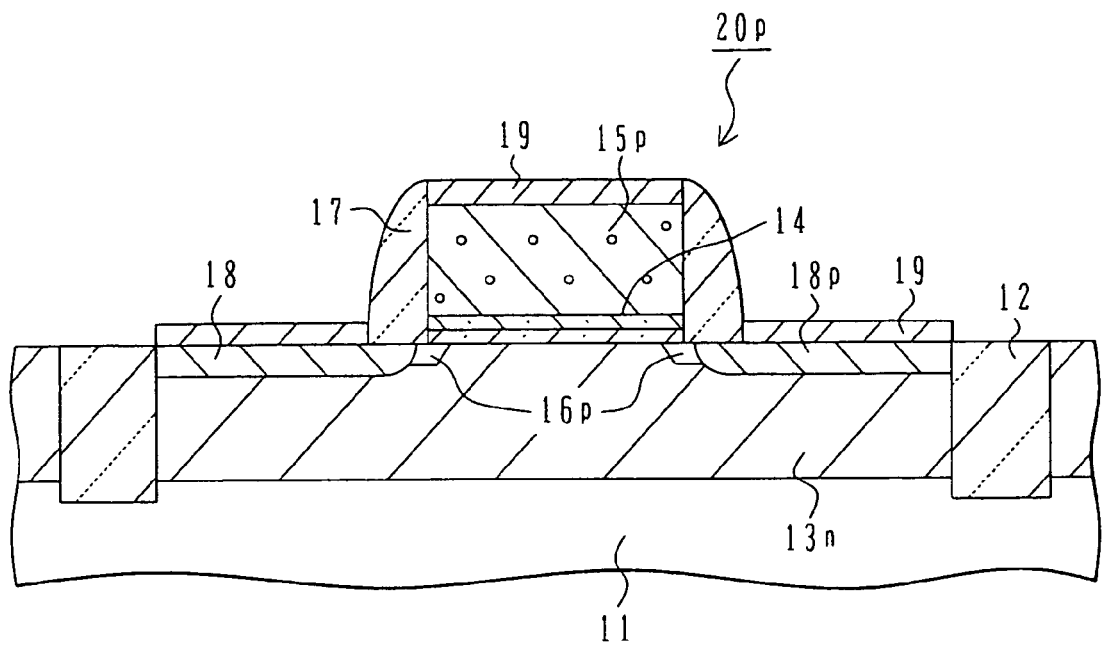
FIGS. 6A and 6B are schematic cross-sectional views illustrating the structures of an IG-FET and a semiconductor device.

FIG. 6A shows the structure of a p-channel IG-FET. An isolation region 12 is formed in a silicon substrate 11 by shallow trench isolation (STI), and a n-type well 13n is formed in an active region. Also, an p-type well or wells are formed in other regions. Agate insulation film 14 is formed on the surface of the active region. The gate insulation film 14 is formed by the lamination of a chemical oxide film and a high specific-dielectric-constant insulation film incorporating nitrogen.

For example, a source gas containing TDMAHf, TTBAl and oxygen by a predetermined ratio, nitridizing gas and nitridation enhancing gas are supplied to the surface of the silicon substrate on which the chemical oxide film is formed, to form an $Hf_{0.8}Al_{0.2}O{:}N$ film by thermal CVD. A single-layered high specific-dielectric-constant insulation film incorporating nitrogen may be formed in place of the lamination of the silicon oxide film and the high specific-dielectric-constant insulation film incorporating nitrogen.

A gate electrode 15p of p-type polycrystalline silicon doped with boron (B) is formed on the gate insulation film 14. P-type extension regions 16p are formed in the surface of the substrate on both sides of the gate electrode 15p. Sidewall spacers 17 of a silicon oxide or so are formed on the side walls of the gate electrode 15p, and p-type source/drain regions 18p with a high concentration are formed in the substrate outside the sidewall spacers 17. Silicide layers 19 of CoSi or so are formed on the gate electrode 15p and the source/drain regions 18p. An p-channel IG-FET 20p is fabricated in this manner.

With the structure where the gate insulation film is formed by using a high specific-dielectric-constant insulation film, the physical film thickness can be increased to suppress the tunnel current even if the equivalent silicon oxide thickness is small. Since nitrogen is incorporated in the gate insulating film, it is possible to prevent penetration of impurity doped in the gate electrode into the channel region.

Figure 6B:
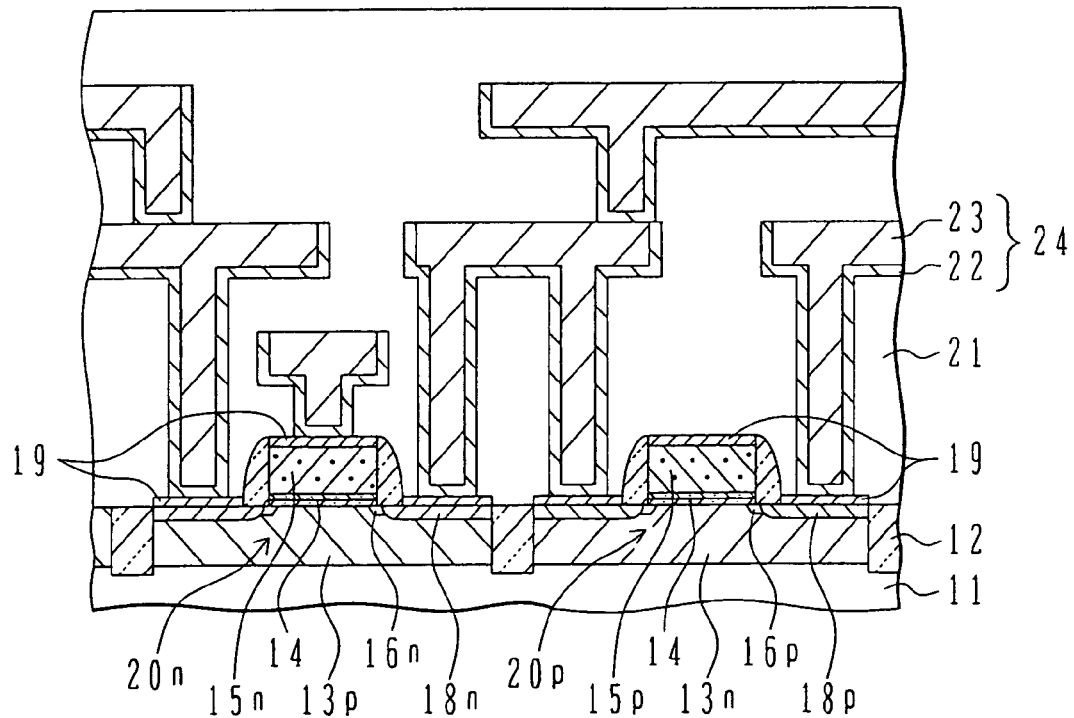

FIG. 6B shows a structure of a semiconductor integrated circuit device. An p-type well 13$p$ is also formed in a silicon substrate 11 together with an n-type well 13$n$. A p-channel IG-FET 20$p$ is formed in the n-type well 13$n$. A n-channel IG-FET 20$n$ is formed in the p-type well 13$p$. The letters "p" and "n" after reference symbols indicate the conductivity types. The n-channel IG-FET 20$n$ has such a structure where the conductivity types of the respective semiconductor regions of the p-channel IG-FET are reversed.

In both the p-channel IG-FET and the n-channel IG-FET, the gate insulation film 14 is formed using a common high specific-dielectric-constant insulation film of $Hf_{0.8}Al_{0.2}O$ incorporating nitrogen. High specific-dielectric-constant film incorporating nitrogen is not only effective to prevent penetration of p-type impurity, boron, but also effective to prevent penetration of n-type impurities, P and/or As.

An interlevel insulation film 21 is formed over the gate electrode, and multi-layered wirings 24 are formed in the interlevel insulation film 21. Each of the multi-layered wirings 24 is formed by using a barrier metal layer 22 and a main wiring layer 23 of copper, copper alloy, aluminum or so.

While the present invention has been described in connection with the embodiments, the invention is not limited thereto. For example, the composition of HfAlO:N is not limited to $Hf_{0.8}Al_{0.2}O$:N. Further, other metal oxides incorporating nitrogen may be used as well.

It will be apparent to those skilled in the art that other various modifications, improvements, and combinations can be made.

INDUSTRIAL APPLICABILITY

The invention can be applied to semiconductor integrated circuit devices or so including a miniaturized IG-FET.

I claim:

1. A method of manufacturing a semiconductor device comprising the steps of:

(a) heating a silicon substrate in a reaction chamber wherein said silicon substrate is heated to a temperature of 400°C. to 600°C.; and (b) supplying film-forming gas containing source gas, nitridizing gas, and nitridation enhancing gas to a surface of said heated silicon substrate, to deposit on said silicon substrate a high specific-dielectric-constant insulation film having a higher specific dielectric constant than that of silicon oxide, by thermal CVD, and said nitridation enhancing gas is a gas containing hydrogen, wherein said source gas is a gas containing organic metal compound of Hf, and organic metal compound of Al, in the carrier gas.

2. The method according to claim 1, further comprising the step of forming a chemical oxide layer on said surface of said silicon substrate before said step (a).

3. The method according to claim 1, wherein said film-forming gas also contains oxygen.

4. The method according to claim 1, wherein said silicon substrate has a silicon oxide film with a thickness of at most about 1 nm on the surface of said silicon substrate, and said film-forming gas does not contain oxygen.

5. The method according to claim 1, wherein said nitridizing gas is a gas containing at least one of ammonia, bis-tertial-butyl amino silane (BTBAS), and triethyl amine (TEN).

6. The method according to claim 1, wherein thermal CVD is performed under a pressure of 10 Pa to 100 Pa at said step (b).

7. The method according to claim 1, wherein said step (b) changes a composition ratio of the film-forming gas with time.

8. The method according to claim 7, wherein said step (b) alternately supplies the source gas and the nitridizing gas.

9. The method according to claim 8, wherein period of said alternate supply is in a range of 10 seconds to 120 seconds.

* * * * *